US006783692B2

(12) United States Patent
Bhagwagar

(10) Patent No.: US 6,783,692 B2
(45) Date of Patent: Aug. 31, 2004

(54) HEAT SOFTENING THERMALLY CONDUCTIVE COMPOSITIONS AND METHODS FOR THEIR PREPARATION

(75) Inventor: Dorab Edul Bhagwagar, Saginaw, MI (US)

(73) Assignee: Dow Corning Corporation, Midland, MI (US)

( * ) Notice: Subject to any disclaimer, the term of this patent is extended or adjusted under 35 U.S.C. 154(b) by 0 days.

(21) Appl. No.: 10/273,726

(22) Filed: Oct. 17, 2002

(65) Prior Publication Data

US 2004/0075076 A1 Apr. 22, 2004

(51) Int. Cl.[7] .............................. C09K 5/00; H05K 7/20; H01L 23/34; C08L 83/06

(52) U.S. Cl. ..................... 252/70; 165/185; 165/104.15; 252/502; 252/511; 252/512; 252/521.3; 257/706; 257/712; 257/791; 257/E23.106; 257/E23.107; 257/E23.12; 361/706; 361/707; 361/708; 361/709; 361/712; 361/713; 428/447; 524/404; 524/406; 524/424; 524/428; 524/430; 524/432; 524/433; 524/436; 524/439; 524/442

(58) Field of Search .......................... 252/70, 502, 511, 252/512, 521.3; 165/185, 104.15; 257/706, 712, 791, E23.106, E23.107, E23.12; 361/706, 707, 708, 709, 712, 713; 428/447; 524/404, 406, 424, 428, 430, 432, 433, 436, 439, 442

(56) References Cited

U.S. PATENT DOCUMENTS

| | | | |
|---|---|---|---|
| 4,282,346 A | 8/1981 | Sharkey ....................... 528/338 |
| 4,299,715 A | 11/1981 | Whitfield et al. ............. 252/74 |
| 4,501,861 A | 2/1985 | Woodbrey ................... 525/421 |
| 4,558,110 A | 12/1985 | Lee ............................. 528/26 |
| 4,604,442 A | 8/1986 | Rich ............................ 528/28 |
| 4,631,329 A | 12/1986 | Gornowica et al. .......... 528/28 |
| 4,793,555 A | 12/1988 | Lee et al. ...................... 239/6 |
| RE33,141 E | 1/1990 | Gornowicz et al. .......... 528/28 |
| 5,015,413 A | 5/1991 | Nagaoka ..................... 252/511 |
| 5,250,228 A | 10/1993 | Baigrie et al. ............... 252/511 |
| 5,380,527 A | 1/1995 | Legrow et al. .............. 424/401 |
| 5,493,041 A | 2/1996 | Biggs et al. ................. 556/453 |
| 5,563,297 A | 10/1996 | Donatelli et al. ........... 524/267 |
| 5,688,862 A | 11/1997 | Kondou et al. .............. 524/780 |
| 5,904,796 A | 5/1999 | Freuler et al. .............. 156/278 |
| 5,912,805 A | 6/1999 | Freuler et al. .............. 361/705 |
| 5,929,164 A | 7/1999 | Zhang ......................... 524/862 |
| 5,930,893 A | 8/1999 | Eaton ....................... 29/890.03 |
| 5,950,066 A | 9/1999 | Hanson et al. .............. 428/551 |
| 5,981,680 A | 11/1999 | Petroff et al. ................ 528/26 |
| 6,051,216 A | 4/2000 | Barr et al. ................. 424/78.35 |
| 6,054,198 A | 4/2000 | Bunyan et al. ............. 428/40.5 |
| 6,150,446 A * | 11/2000 | Numata ....................... 524/406 |
| 6,169,142 B1 | 1/2001 | Nakano et al. .............. 524/862 |
| 6,197,859 B1 | 3/2001 | Green et al. ................. 524/270 |
| 6,284,817 B1 * | 9/2001 | Cross et al. ................. 523/220 |
| 6,286,212 B1 | 9/2001 | Eaton ....................... 29/890.03 |
| 6,605,238 B2 * | 8/2003 | Nguyen et al. .............. 252/502 |
| 6,620,515 B2 * | 9/2003 | Feng et al. .................. 428/447 |
| 6,652,958 B2 * | 11/2003 | Tobita ....................... 428/298.1 |
| 2002/0007035 A1 * | 1/2002 | Nguyen et al. ............... 528/10 |
| 2003/0164223 A1 * | 9/2003 | Cross et al. ................. 156/329 |
| 2004/0026670 A1 * | 2/2004 | Nguyen et al. .............. 252/502 |

FOREIGN PATENT DOCUMENTS

| | | |
|---|---|---|
| DE | 198 39 603 | 3/1999 |
| EP | 0 558 044 | 9/1993 |
| EP | WO 98/35360 | 8/1998 |
| EP | 1 101 167 A1 | 7/1999 |
| EP | 0 987 757 A2 | 3/2000 |
| EP | 1 067 164 A1 | 1/2001 |
| EP | WO 01/68363 A1 | 9/2001 |
| EP | 1 174 462 | 1/2002 |
| EP | 1 197 972 A1 | 4/2002 |
| EP | WO 02/082468 | 10/2002 |
| EP | WO 02/086911 | 10/2002 |
| EP | WO 03/017289 | 2/2003 |
| JP | 63-230781 A | 3/1987 |
| JP | 2002-329989 | 11/2002 |

OTHER PUBLICATIONS

American Chemical Society, "Effect of Stabilization of Polypropylene During Processing and Its Influence on Long–Term Behavior Under Thermal Stress," Hans Sweifel, 1996, pp. 375–396, no month.

Encyclopedia of Polymer Science and Engineering, Scattering to Structural Foams, "Silicones", pp. 242–245, 298–308, Vo. 15, no date.

EIII Semi–Therm Symposium, "Measurements of Adhesive Bondline Effective Thermal Conductivity and Thermal Resistance Using the Laser Flash Method," Robert C. Campbell, Stephen E. Smith and Raymond L. Dietz, pp. 83–97, 1999, no month.

Polymer Bulletin, "Siloxane–Urea Segmented Copolymers," I. Yilgor, J.Riffle, G.Wilkes, J.McGrath, 8, 535–542, 1982, no month.

Thermal Conductivity 25, Thermal Expansion 13, "Laser Flash Diffusivity Measurements of Filled Adhesive Effective Thermal Conductivity and Contact Resistance Using Multilayer Methods," R.C. Campbell, S.E. Smith and R.L. Dietz, Jun. 13–16, 1999, 191–202.

(List continued on next page.)

Primary Examiner—Anthony J. Green
(74) Attorney, Agent, or Firm—Catherine U. Brown

(57) ABSTRACT

A heat softening thermally conductive composition comprises: a matrix comprising a silicone resin, and a thermally conductive filler. The composition can be used as a thermal interface material in electronic devices. The composition is formulated to have any desired softening temperature.

28 Claims, 2 Drawing Sheets

OTHER PUBLICATIONS

Figure 1:
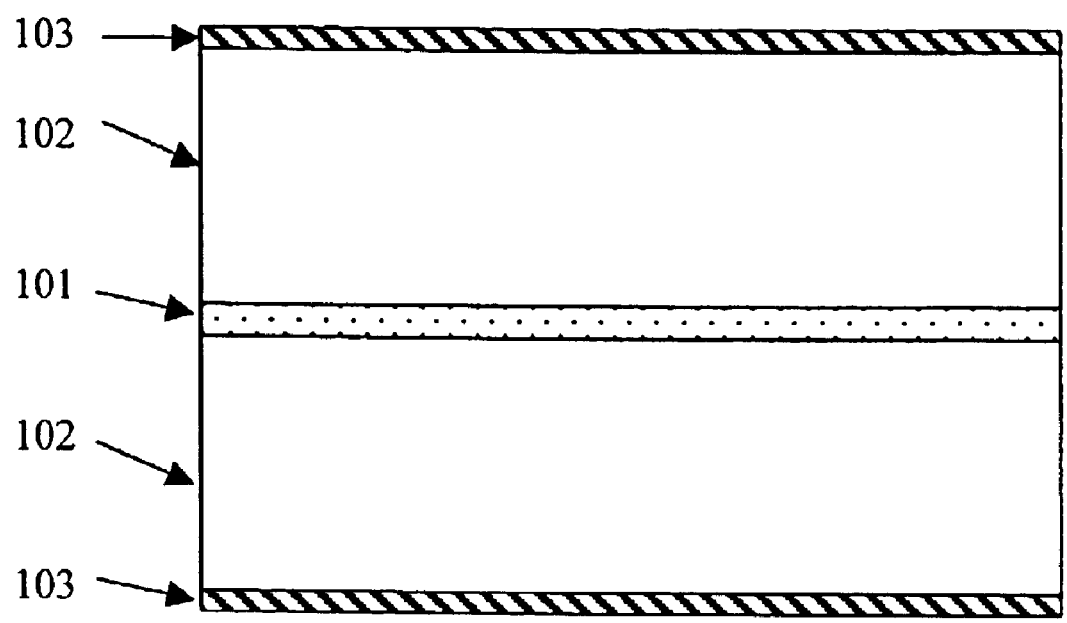

Thermal Trends, "Parameter Optimization for Measuring Thermal Properties of Electronic Materials Using the Transient Plane Source Technique", Craig Dixon, Michael Strong and S. Mark Zhang, vol. 7, No. 5, pp. 1–10, 2000, no month.

Thesis, "The Thermal, Dynamic Mechanical and Morphological Properties of Silicone Adhesives," by Bruce Campbell Copley, submitted to the Faculty of the Graduate School of the University of Minnesota, Master of Science Degree, Mar. 1984.

ITherm abstract, "Silicone Organic Phase Change Materials for TIM". M.Zhang, D.Swarthout and J. Feng, no date.

A. Polym. Preprints, "Dynamic Mechanical Properties of Interpenetrating Polymer Networks of Trimethylsiloxy Silicates (MQ) and Polydimethyl Siloxanes (PDMS)," Jeffrey H. Wengrovius, Timothy B. Burnell, Michael A. Zumbrum, and Mary A. Krenceski, 1998, 39(1), pp. 512–513, no month.

ITherm abstract, "Novel Silicone Based Phase Change Thermal Interface Materials", Bhagwagar, Nguyen, Mojica, no date.

"Alkyl Methyl Silicone Phase Change Materials for Thermal Interface Applications," Zhang, Swarthout, Feng, Petroff, Noll, Gelderbloom, Houtman and Wall, no date.

ASTM Standards, "Standard Test Methdo for Thermal Diffusivity by the Flash Method", pp. 1–13, no date.

The Polymeric Materials Encyclopedia, "Siloxane–Containing Polymers", Bogdan Simionescu, Valeria Harabagiu and Cristofer Simionescu, CRC Press, Inc. 1996, no month.

Thermoplastic Elastomers, A Comprehensive Review, "Research on Thermoplastic Elastomers", James E. McGrath, Hanser Publishers, 1987, no month.

* cited by examiner

US 6,783,692 B2

HEAT SOFTENING THERMALLY CONDUCTIVE COMPOSITIONS AND METHODS FOR THEIR PREPARATION

FIELD OF THE INVENTION

This invention relates to a heat softening thermally conductive (HSTC) composition and methods for preparation and use of the same. More particularly, this invention relates to a HSTC composition comprising a silicone resin system and a thermally conductive filler. The HSTC composition can be used as a thermal interface material (TIM).

BACKGROUND

Electronic components such as semiconductors, transistors, integrated circuits (ICs), discrete devices, and others known in the art are designed to operate at a normal operating temperature or within a normal operating temperature range. However, the operation of an electronic component generates heat. If sufficient heat is not removed, the electronic component will operate at a temperature significantly above its normal operating temperature. Excessive temperatures can adversely affect performance of the electronic component and operation of the device associated therewith and negatively impact mean time between failures.

To avoid these problems, heat can be removed by thermal conduction from the electronic component to a heat sink. The heat sink can then be cooled by any convenient means such as convection or radiation techniques. During thermal conduction, heat can be transferred from the electronic component to the heat sink by surface contact between the electronic component and the heat sink or by contact of the electronic component and heat sink with a TIM.

Surfaces of the electronic component and the heat sink are typically not completely smooth, therefore, it is difficult to achieve full contact between the surfaces. Air spaces, which are poor thermal conductors, appear between the surfaces and increase impedance. These spaces can be filled by inserting a TIM between the surfaces. The lower the thermal resistance of the TIM, the greater the flow of heat from the electronic component to the heat sink.

Some commercially available TIMs are elastomers filled with thermally conductive fillers. However, elastomers suffer from the drawbacks that a high pressure is required to reduce the thermal interfacial contact resistance and promote effective heat transfer between the substrate and the TIM.

Silicone greases with conductive fillers have also been proposed as TIMs. However, greases suffer from the drawbacks that they can be messy to apply and can flow out of the spaces after application.

HSTC compositions are advantageous in solving the above problems because they can be handled as a solid at low temperatures and soften at an elevated temperature. The softening temperature can be equal to or above the normal operating temperature of the electronic component.

HSTC compositions can comprise organic materials such as waxes, and conductive fillers. However, organic waxes suffer from the drawback that they can flow out of the spaces after application, during operation of the electronic component. Organic waxes may also be brittle at room temperature.

SUMMARY OF THE INVENTION

This invention relates to a heat softening thermally conductive (HSTC) composition and methods for its preparation and use. The HSTC composition comprises a matrix and a thermally conductive filler. The matrix comprises a silicone resin.

DRAWINGS

Figure 2:
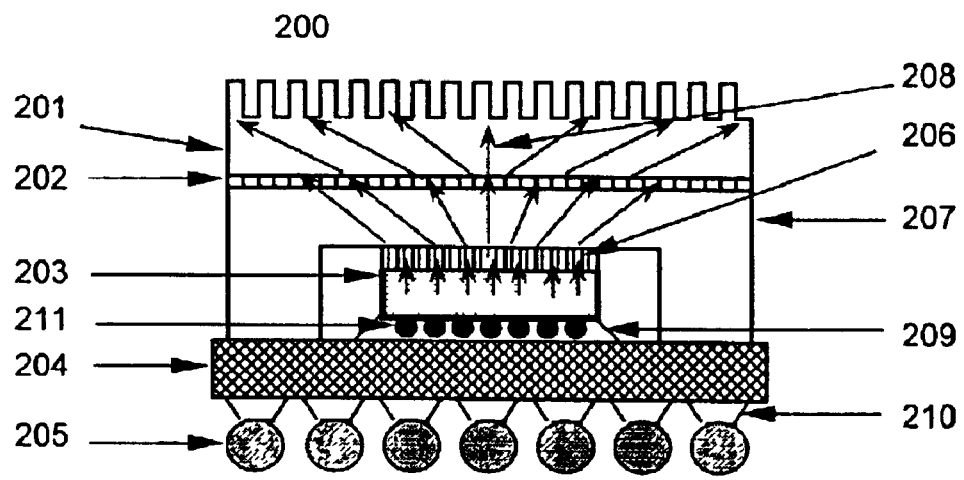

FIG. 1 is an interface material according to this invention.
FIG. 2 is a device according to this invention.

REFERENCE NUMERALS 100 interface material
101 substrate
102 layer of HSTC composition
103 release liners
200 device
201 heat sink
202 second thermal interface material (TIM2)
203 electronic component
204 substrate
205 solder balls
206 first thermal interface material (TIM1)
207 metal cover
208 thermal path represented by arrows
209 chip underfill
210 pads
211 solderball array

DETAILED DESCRIPTION OF THE PREFERRED EMBODIMENTS

All amounts, ratios, and percentages are by weight unless otherwise indicated. The following is a list of definitions, as used herein.

Definitions and Usage of Terms

"A" and "an" each mean one or more.

"Alkyl" means a monovalent saturated hydrocarbon group.

"Combination" means two or more items put together by any method.

"Copolymer" means a polymer made from at least two distinct monomers. Copolymer includes, but is not limited to, polymers made from only two distinct monomers.

"D unit" means a unit of the formula $R_2SiO_{2/2}$, where each R is an organic group.

"M unit" means a unit of the formula $R_3SiO_{1/2}$, where each R is an organic group.

"Q unit" means a unit of the formula $SiO_{4/2}$.

"Siloxane" and "silicone" are used synonymously herein.

"Silicone resin" means a polymer having a branched molecular structure comprising $R_xSiO_{(4-x)/2}$ units where each R is an organic group; each x is 0, 1, 2, or 3; with the proviso that at least one unit has x greater than 1.

"Substituted" means one or more hydrogen atoms bonded to a carbon atom has been replaced with another substituent.

"Surface treated" means that all, or a portion of, reactive groups on a filler particle have been rendered less reactive by any convenient chemical or unreactive means.

"T unit" means a unit of the formula $RSiO_{3/2}$, where R is an organic group.

Heat Softening Thermally Conductive Compostion

This invention relates to a HSTC composition. The HSTC composition comprises:

A) a matrix comprising a silicone resin,
B) a thermally conductive filler,
optionally C) a treating agent, and
optionally D) an antioxidant.

Matrix

Silicone resins are known in the art and commercially available. Silicone resins can be added to the composition in an amount of 4 to 60% of the composition. Silicone resins can comprise combinations of M, D, T, and Q units, such as DT, MDT, DTQ, MQ, MDQ, MDTQ, or MTQ resins; alternatively DT or MQ resins.

DT resins are exemplified by resins comprising the formula: $(R^1R^2SiO_{2/2})_a(R^3SiO_{3/2})_b$.

Each instance of $R^1$, $R^2$ and $R^3$ may be the same or different. $R^1$, $R^2$ and $R^3$ may be different within each unit. Each $R^1$, $R^2$ and $R^3$ independently represent a hydroxyl group or an organic group, such as a hydrocarbon group or alkoxy group. Hydrocarbon groups can be saturated or unsaturated. Hydrocarbon groups can be branched, unbranched, cyclic, or combinations thereof. Hydrocarbon groups can have 1 to 40 carbon atoms, alternatively 1 to 30 carbon atoms, alternatively 1 to 20 carbon atoms, alternatively 1 to 10 carbon atoms, alternatively 1 to 6 carbon atoms. The hydrocarbon groups include alkyl groups such as methyl, ethyl, n-propyl, isopropyl, n-butyl, and t-butyl; alternatively methyl or ethyl; alternatively methyland include aromatic groups such as phenyl, tolyl, xylyl, benzyl, and phenylethyl; alternatively phenyl. Unsaturated hydrocarbon groups include alkenyl such as vinyl, allyl, butenyl, and hexenyl.

In the formula above, a is 1 to 200, alternatively 1 to 100, alternatively 1 to 50, alternatively 1 to 37, alternaively 1 to 25. In the formula above, b is 1 to 100, alternatively 1 to 75, alternatively 1 to 50, alternatively 1 to 37, alternatively 1 to 25.

Alternatively, the DT resin may have the formula: $(R^1_2SiO_{2/2})_a(R^2_2SiO_{2/2})_b(R^1SiO_{3/2})_a(R^2SiO_{3/2})_b$, where $R^1$, $R^2$, a, and b are as described above. Alternatively, in this formula, each $R^1$ may be an alkyl group and each $R^2$ may be an aromatic group.

MQ resins are exemplified by resins of the formula: $(R^1R^2R^3SiO_{1/2})_c(SiO_{4/2})_d$, where $R^1$, $R^2$ and $R^3$ are as described above, c is 1 to 100, and d is 1 to 100, and the average ratio of c to d is 0.65 to 1.9.

A silicone polymer may be added to component A) in addition to, or instead of a portion of, the silicone resin. The silicone polymer can be added in an amount of 0 to 35% of the composition. The silicone polymer can be a linear or branched polydiorganosiloxane, such as a polydimethylsiloxane. Silicone polymers are exemplified by polymers of the formula $(R^1R^2R^3SiO_{1/2})_2(R^1R^2SiO_{2/2})_e$, where $R^1$, $R^2$ and $R^3$ are as described above, and e is 5 to 800, alternatively 50 to 200.

The combination of M, D, T, and Q units and the presence of silicone polymer influence the physical and rheological properties of the material. Typically, such compositions have a broad glass transition temperature (Tg) range. Over this range the composition undergoes a significant decrease in modulus and viscosity with increase in temperature. This results in the gradual softening or hardening of the HSTC composition. For example, B. H. Copely, MS Thesis, University of Minnesota, 1984 and Wengorvius, J. H.; Burnell, T. B.; Zumbrum, M. A.; Krenceski, M. A. *Polym. Preprints* 1998, 39(J), 512 show the effect of MQ resin/silicone polymer on the glass transition temperature. For the purposes of this invention, the silicone resin or silicone resin/silicone polymer combination may be chosen such that it possess the required physical integrity and modulus to be handled as a film close to ambient temperature. This facilitates ease of application of the HSTC composition as TIM in a film form. The viscosity of the matrix at room temperature can be above 100 Pascal·second (Pa·s). Concurrently, the appropriate silicone resin or silicone resin/silicone polymer combination is selected to undergo a large decrease in modulus and viscosity at operating or assembly temperature. This facilitates intimate contact of the composition between the heat generating and heat dissipating substrates. Above 90° C., the viscosity of the matrix can be below 10 Pa·s.

In effect, the combination of M, D, T, and Q units on the silicone resin or the combination of the silicone resin and silicone polymer are selected to permit a sufficiently large change in viscosity between the application temperature and assembly temperature or operating temperature. The silicone resin can also be chosen to be tacky at room temperature. TIMs prepared from such matrices would be advantageous as they would permit easy assembly.

The composition can comprise at least 4%, alternatively at least 5% of component A). The composition can comprise up to 60% of component A), alternatively up to 50%, alternatively up to 20%, alternatively up to 10%.

It should be understood that the disclosure of ranges herein should be taken not only to disclose the range itself but also anything subsumed therein, as well as endpoints. For example, disclosure of a range of 1 to 10 should be understood to disclose not only the range of 1 to 10, but also 1, 2.7, 9 and 10 individually, as well as any other number subsumed in the range. Similarly, disclosure of a range of hydrocarbons of 1 to 5 carbon atoms should be understood to disclose not only hydrocarbons of 1 to 5 carbon atoms as a class, but also hydrocarbons of 1 carbon atom, hydrocarbons of 2 carbon atoms, hydrocarbons of 3 carbon atoms, hydrocarbons of 4 carbon atoms and hydrocarbons of 5 carbon atoms individually.

Filler

Component B) is a thermally conductive filler. Component B) is dispersed in component A). The amount of component B) in the composition depends on various factors including the material selected for component A), the material selected for component B), and the softening temperature of the composition. The amount of component B) can be at least 40% of the overall composition, alternativley at least 50% of the composition, alternatively at least 80% of the composition, alternatively at least 85% of the composition. The amount of component B) can be up to 96%, alternatively up to 95% of the composition. If the amount of component B) is too low, the composition may have insufficient thermal conductivity for some applications.

Component B) can be thermally conductive, electrically conductive, or both. Alternatively, component B) can be thermally conductive and electrically insulating. Suitable thermally conductive fillers for component B) include metal particles, metal oxide particles, and a combination thereof. Suitable thermally conductive fillers for component B) are exemplified by aluminum nitride; aluminum oxide; barium titinate; beryllium oxide; boron nitride; diamond; graphite; magnesium oxide; metal particulate such as copper, gold, nickel, or silver; silicon carbide; tungsten carbide; zinc oxide, and a combination thereof.

Thermally conductive fillers are known in the art and commercially available, see for example, U.S. Pat. No. 6,169,142 (col. 4, lines 7–33). For example, CB-A20S and Al-43-Me are aluminum oxide fillers of differing particle sizes commercially available from Showa-Denko, and AA-04, AA-2, and AA18 are aluminum oxide fillers commercially available from Sumitomo Chemical Company.

Silver filler is commercially available from Metalor Technologies U.S.A. Corp. of Attleboro, Mass., U.S.A. Boron nitride filler is commercially available from Advanced Ceramics Corporation, Cleveland, Ohio, U.S.A.

The shape of the filler particles is not specifically restricted, however, rounded or spherical particles may prevent viscosity increase to an undesirable level upon high loading of the filler in the composition.

A combination of fillers having differing particle sizes and different particle size distributions may be used as component B). For example, it may be desirable to combine a first aluminum oxide having a larger average particle size with a second aluminum oxide having a smaller average particle size in a proportion meeting the closest packing theory distribution curve. This improves packing efficiency and may reduce viscosity and enhance heat transfer.

The average particle size of the filler will depend on various factors including the type of filler selected for component B) and the exact amount added to the composition, however, the filler can have an average particle size of at least 0.2, alternatively at least 2 micrometers. The filler can have an average particle size of up to 80 micrometers, alternatively up to 50 micrometers.

The filler for component B) may optionally be surface treated. Treating agents and treating methods are known in the art, see for example, U.S. Pat. No. 6,169,142 (col. 4, line 42 to col. 5, line 2). The composition may comprise at least 0.05% of C) a treating agent. The HSTC composition may comprise up to 5%, alternatively up to 2%, alternatively up to 0.5%, of a C) treating agent.

The treating agent can be an alkoxysilane having the formula: $R^4_f Si(OR^5)_{(4-f)}$, where f is 1, 2, or 3; alternatively x is 3. $R^4$ is a substituted or unsubstituted monovalent hydrocarbon group of at least 1 carbon atom, alternatively at least 8 carbon atoms. $R^4$ has up to 50 carbon atoms, alternatively up to 30 carbon atoms, alternatively up to 18 carbon atoms. $R^4$ is exemplified by alkyl groups such as hexyl, octyl, dodecyl, tetradecyl, hexadecyl, and octadecyl; and aromatic groups such as benzyl and phenylethyl. $R^4$ can be saturated or unsaturated, branched or unbranched, and unsubstituted. $R^4$ can be saturated, unbranched, and unsubstituted.

$R^5$ is an unsubstituted, saturated hydrocarbon group of at least 1 carbon atom. $R^5$ may have up to 4 carbon atoms, alternatively up to 2 carbon atoms. Component C) is exemplified by hexyltrimethoxysilane, octyltriethoxysilane, decyltrimethoxysilane, dodecyltrimethyoxysilane, tetradecyltrimethoxysilane, phenyltrimethoxysilane, phenylethyltrimethoxysilane, octadecyltrimethoxysilane, octadecyltriethoxysilane, and a combination thereof.

Alkoxy-functional oligosiloxanes can also be used as treatment agents. Alkoxy-functional oligosiloxanes and methods for their preparation are known in the art, see for example, EP 1 101 167 A2. For example, suitable alkoxy-functional oligosiloxanes include those of the formula $(R^{60})_g Si(OSiR^7_2 R^8)_{4-g}$. In this formula, g is 1, 2, or 3, alternatively g is 3. Each $R^6$ can be an alkyl group. Each $R^7$ is can be independently selected from unsaturated monovalent hydrocarbon groups of 1 to 10 carbon atoms. Each $R^8$ can be an unsaturated monovalent hydrocarbon group having at least 111 carbon atoms.

Treatment agents can also include alkylthiols such as octadecyl mercaptan and others, fatty acids such as oleic acid, stearic acid, and alcohols such as myristyl alcohol, cetyl alcohol, stearyl alcohol, or a combination thereof.

Treatment agents for alumina or passivated aluminum nitride could include alkoxysilyl functional alkylmethyl polysiloxanes (e.g., partial hydrolysis condensate of $R^9_h R^{10}_i Si(OR^{11})(4-h-i)$ or cohydrolysis condensates or mixtures), similar materials where the hydrolyzable group would be silazane, acyloxy or oximo. In all of these, a group tethered to Si, such as $R^9$ in the formula above, is a long chain unsaturated monovalent hydrocarbon or monovalent aromatic-functional hydrocarbon. $R^{10}$ is a monovalent hydrocarbon group, and $R^{11}$ is a monovalent hydrocarbon group of 1 to 4 carbon atoms. In the formula above, h is 1, 2, or 3 and i is 0, 1, or 2, with the proviso that h+i is 1, 2, or 3. One skilled in the art could optimize a specific treatment to aid dispersion of the filler without undue experimentation.

Other Optional Components

Component B), the thermally conductive filler, may optionally comprise a reinforcing filler in addition to the thermally conductive filler, or instead of a portion of the thermally conductive filler. The reinforcing filler can be a chopped fiber, such as chopped KEVLAR®. Without wishing to be bound by theory, it is thought that chopped KEVLAR® improves strength and coefficient of thermal expansion (CTE). Reinforcing fillers may also be treated with component C).

Optional component D) is an antioxidant. Without wishing to be bound by theory, it is thought that component D) prevents chain cleavage or decomposition of the silicone resin, the silicone polymer, or the filler treating agent. Component D) can comprise any antioxidant commonly used in plastics such as polypropylene. Component D) can be added to the composition in an amount of at least 0.001%, alternatively at least 0.05% up to 1%.

Suitable antioxidants are known in the art and commercially available. Suitable antioxidants include phenolic antioxidants and combinations of phenolic antioxidants with stabilizers. Phenolic antioxidants include fully sterically hindered phenols and partially hindered phenols. Stabilizers include organophosphorous derivatives such as trivalent organophosphorous compound, phosphites, phosphonates, and a combination thereof; thiosynergists such as organosulfur compounds including sulfides, dialkyldithiocarbamate, dithiodipropionates, and a combination thereof; and sterically hindered amines such as tetramethyl-piperidine derivatives. Suitable antioxidants and stabilizers are disclosed in Zweifel, Hans, "Effect of Stabilization of Polypropylene During Processing and Its Influence on Long-Term Behavior under Thermal Stress," Polymer Durability, Ciba-Geigy AG, Additives Division, CH-4002, Basel, Switzerland, American Chemical Society, vol. 25, pp. 375–396, 1996.

Suitable phenolic antioxidants include vitamin E and IRGANOX® 1010 from Ciba Specialty Chemicals, U.S.A. IRGANOX® 1010 comprises pentaerythriol tetrakis(3-(3,5-di-tbutyl-4-hydroxyphenyl)propionate).

Optional component E) is an inhibitor. Component E) can be an addition reaction catalyst inhibitor. Addition reaction catalyst inhibitors are known in the art and commercially available, see for example, U.S. Pat. No. 5,929,164 (col. 1, line 65 to col. 3, line 65).

Component E) can be a phosphine, a diphosphine, an amine, a diamine, a triamine, an organic sulfide, an alkenyl-functional compound, an alkynyl-functional compound, a hydroxy-functional compound, a combination thereof, or any other transition metal catalyst poison.

Suitable phosphines include trialkyl phosphines and triaryl phosphines such as triphenyl phosphine. Suitable diphosphines include tetraphenylethylene diphosphine. Suitable amines include n-butyl amine and triethanolamine. Suitable diamines include tetramethylenediamine. Suitable organic sulfides include ethyl phenyl sulfide. Suitable alkenyl-functional compounds can be organic, organosilicones, or organosilanes. Suitable alkenyl-functional compounds include vinylsiloxanes and vinylsilanes. Suitable alkynyl functional compounds can be organic, such as acetylene, propyne, 1-butyne, 1-pentyne, 4,4-dimethyl-1-pentyne, 1-hexyne, 5-methyl-1-hexyne, and 1-decyne.

Component E) is added in an amount sufficient to provide mechanical and chemical stability to the HSTC composition for a period of at least 7 years when the composition is to be used in a central processing unit (CPU) device. The amount of component E) can be at least 0.001%. The amount of component E) can be up to 1%.

Component F) is an optional matrix material that can be added in addition to component A) or instead of a portion of component A). Component F) can comprise an organofunctional silicone wax, a silicone-organic block copolymer, or a combination thereof.

Component G) is a vehicle such as a solvent or diluent. Component G) can be added during preparation of the composition, for example, to aid mixing and delivery. All or a portion of component G) may optionally be removed after the HSTC composition is prepared.

Component H) is a wetting agent.

Component I) is an antifoaming agent.

Component J) is a pigment.

Component K) is a flame retardant.

Component L) is a spacer. Spacers can comprise organic particles, inorganic particles, or a combination thereof. Spacers can be thermally conductive, electrically conductive, or both. Spacers can have a particle size of at least 25 micrometers up to 250 micrometers. Spacers can comprise monodisperse beads. The amount of component L) depends on various factors including the distribution of particles, pressure to be applied during placement, and temperature of placement. The composition can contain up to 15%, alternatively up to 5% of component L) added in addition to, or instead of, a portion of component B).

Component M is a low melting metal filler. The low melting metal filler can comprise In, Sn, or an alloy thereof. The low melting metal filler may optionally further comprise Ag, Bi, Cd, Cu, Ga, Pb, Zn, or a combination thereof. Examples of suitable low melting metal fillers include In-Bi-Sn alloys, Sn-In-Zn alloys, Sn-In-Ag alloys, Sn-Ag-Bi alloys, Sn-Bi-Cu-Ag alloys, Sn-Ag-Cu-Sb alloys, Sn-Ag-Cu alloys, Sn-Ag alloys, Sn-Ag-Cu-Zn alloys, and combinations thereof. The low melting metal filler can have a melting point of up to 250° C., alternatively up to 225° C. The low melting metal filler can have a melting point of at least 50° C., alternatively at least 150° C. The low melting metal filler can be a eutectic alloy, a non-eutectic alloy, or a pure metal. Low melting metal fillers are known in the art and commercially available. Component M) can be added in addition to, or instead of, all or a portion of component B): The composition may contain up to 96% of component M).

Method of Preparation of the Heat Softening Thermally Conductive Composition

Component A) is selected such that the composition can be handled as a solid at room temperature and deformable at or above assembly temperature of the electronic device.

The HSTC composition can be formulated to have a thermal conductivity of at least 0.8 Watts per meter Kelvin (W/mK), alternatively at least 2 W/mK. Thermal conductivity depends on various factors including the amount and type of filler selected for component B).

The HSTC composition can be prepared by any convenient means, such as mixing all components at a temperature higher than the softening temperature When component C) is present, the HSTC composition may optionally be prepared by surface treating component B) with component C) and thereafter mixing the composition at a temperature above the softening temperature. Alternatively, component C) may be mixed with some or all of the other components simultaneously at a temperature above the softening temperature.

When component G) is present, the composition can be prepared by mixing all components at ambient or elevated temperature.

Methods of Use

The HSTC composition described above can be used as an interface material, such as a thermal interface material (TIM). The interface material may have any convenient configuration, and one skilled in the art would be able to control the configuration by appropriate selection of component A), and other components. The HSTC composition can be formulated to be form stable under ambient conditions. The HSTC composition can be formulated to be self-supporting under ambient conditions. The HSTC composition may optionally be provided as a flat member, such as a pad, tablet, sheet, or tape. Alternatively, the HSTC composition may be provided as a hemispherical nubbin, a convex member, a pyramid, or a cone. Without wishing to be bound by theory, it is thought that component A) can make HSTC composition a tacky solid under ambient conditions, and that the tackiness will be advantageous in application of the HSTC composition to a substrate.

The HSTC composition may optionally have a removable release sheet over a surface. A release sheet can be used when the HSTC composition is tacky at ambient conditions. The release sheet can be, for example, a wax- or silicone-coated paper or plastic sheet having a relatively low surface energy. The HSTC composition may be applied to a face stock, liner, or other release sheet by any conventional means such as a direct process, e.g., spray-coating, knife-coating, roller coating, casting, drum coating, dipping or the like or an indirect transfer process using a release sheet. A solvent, diluent, or other vehicle may be added to the HSTC composition before application, and thereafter the vehicle is removed to leave an adherent film, coating, or residue of the HSTC composition on the release sheet.

The HSTC composition may optionally be coated on a substrate, for example, when the HSTC composition lacks sufficient form stability during processing. The substrate can be a thermally conductive material, an electrically conductive material, or both. The substrate can be, for example, a metal foil or perforated metal foil, such as gold, silver, copper, or aluminum foil; polyimide; polyamide; KAPTON®) from E. I. Du Pont de Nemours and Company, Inc., of Wilmington, Del., U.S.A.; or polyethylene terephthalate polyester (MYLAR® from E. I. Du Pont de Nemours and Company, Inc., of Wilmington, Del., U.S.A.). The composition can be coated on one or more surfaces of the substrate. Release sheets may be used on both sides of the coated substrate. This interface material is shown in FIG. 1. In FIG. 1, the interface material 100 comprises a substrate 101, and layers of the HSTC composition described above 102 formed on opposing sides of the substrate 101. Release liners 103 are applied over the exposed surfaces of the HSTC composition 102.

Various interface materials comprising the HSTC composition described above can be prepared. The HSTC composition described above can be used to prepare interface materials by various methods, including those disclosed in U.S. Pat. Nos. 4,299,715 and 5,904,796.

The HSTC composition can be interposed along a thermal path between a heat source a heat spreader. The HSTC composition can be interposed by any convenient means, such as applying a form stable HSTC composition or interface material comprising the HSTC composition between the heat source and the heat spreader with or without an adhesive or primer, hot-melt dispensing the HSTC composition, or solvent casting the HSTC composition.

The heat source can comprise an electronic component such as a semiconductor, a transistor, an integrated circuit, or a discrete device.

The heat spreader can comprise a heat sink, a thermally conductive plate, a thermally conductive cover, a fan, a circulating coolant system, a combination thereof, or others. The HSTC composition can be used in direct contact with the electronic component and the heat sink. The HSTC composition can be applied either to the electronic component and thereafter the heat sink, or the HSTC composition can be applied to the heat sink and thereafter to the electronic component.

During or after interposing the HSTC composition along the thermal path, the HSTC composition can be heated to a temperature equal to or greater than the softening temperature. Pressure may be applied. The HSTC composition can then be cooled.

This invention further relates to a product comprising:

a) an electronic component, b) an interface material, and c) a heat sink;

where the interface material is arranged along a thermal path extending from a surface of the electronic component to a surface of the heat sink, where the interface material comprises the composition described above.

This invention further relates to a product comprising:

a) a heat spreader, and b) an interface material on a surface of the heat spreader, where the interface material and the heat spreader are configured to comprise a portion of a thermally conductive path between an electronic component and a heat sink, and where the interface material comprises the composition described above.

FIG. 2 shows a device 200 according to this invention. The device 200 comprises an electronic component (shown as an integrated circuit (IC) chip) 203 mounted to a substrate 204 by a solderball array 211 and chip underfill 209. The substrate 204 has solder balls 205 attached thereto through pads 210. A first interface material (TIM1) 206 is interposed between the IC chip 203 and a metal cover 207. The metal cover 207 acts as a heat spreader. A second interface material (TIM2) 202 is interposed between the metal cover 207 and a heat sink 201. Heat moves along a thermal path represented by arrows 208 when the device is operated.

Products and devices may be prepared including the HSTC composition described above. For example, the HSTC composition described above may be used as the thermally conductive interface materials in the devices disclosed in U.S. Pat. Nos. 5,912,805; 5,930,893; 5,950,066; 6,054,198; and 6,286,212 in addition to, or instead of, the interface materials described therein.

EXAMPLES

These examples are intended to illustrate the invention to one skilled in the art and should not be interpreted as limiting the scope of the invention set forth in the claims. Me represents a methyl group and Ph represents a phenyl group.

Reference Example 1
Laser Flash Method

Thermal impedance measurement of the thermal interface materials are carried out on the Holometrix Microflash 300 equipment (Holometrix Micromet, Bedford, Mass.; now NETZSCH Instruments, Inc.). Silicon wafers for use in the sample preparation are obtained from Addison Engineering, Inc. of San Jose, Calif. The silicon wafers are diced to 8±0.13 millimeter (mm) square substrates and are deionized water rinsed by Silicon Sense of Nashua, N.H.

These silicon wafers are used as substrates to prepare test assemblies for measurement of thermal impedance. To test the thermal impedance, a layer of the HSTC composition is placed on one silicon substrate. A second silicon substrate is placed on top of the HSTC composition to form a sandwiched assembly. A compressive force is applied on the assemblies at different temperatures to monitor the flow of the HSTC composition and measure the resulting bondline thickness under the compressive force/temperature conditions.

The thermal impedance of the assemblies is measured by laser flash methodology. The laser flash method involves rapidly heating one side of the assembly with a single pulse from a laser and monitoring the arrival of the resulting temperature disturbance as a function of time on the opposite surface. The thermal impedance of the thin TIM between the two substrates is measured using multi-layer analysis. Technical details of the method can be found in the instrument manual, as well as in publications by Campbell, R. C.; Smith, S. E.; Dietz, R. L., "Measurements of Adhesive Bondline Effective Thermal Conductivity and Thermal Resistance Using the Laser Flash Method," IEEE SEMI-THERM XV Symposium, (1999) pages 83–97; Campbell, R. C.; Smith, S. E.; Dietz, R. L "Laser Flash Diffusivity Measurements of Filled Adhesive Effective Thermal Conductivity and Contact Resistance Using Multilayer Methods," Thermal Conductivity 25—Thermal Expansion 13, Jun. 13–16, 1999; and "Standard Test Method for Thermal Difusivity of Solids by the Flash Method," ASTM Test Method E1461-92.

Reference Example 2
Measurement of Viscosity

The measurement of complex viscosity of the compositions as a function of temperature is obtained on an Advanced Rheometric Expansion System (ARES) Rheometer from Rheometric Scientific, Piscataway, N.J., USA. The data is recorded by cooling the composition between 25 mm parallel plates from 90 to 30° C., under a dynamic strain of 0.5%, frequency of 1 radian/second, and a cooling rate of 2° C./minute.

Example 1

A silicone resin of the formula: $(Ph_2SiO_{2/2})_{19}(Me_2SiO_{2/2})_{19}(PhSiO_{3/2})_{37}(MeSiO_{3/2})_{25}$ is combined with $Al_2O_3$ filler (2:1 mixture of CB-A20S and Al-43-Me aluminum oxide fillers from Showa-Denko K.K.) by heating the resin and filler to 80° C. and centrifugal mixing. The mixture has 85.65 weight % filler loading.

The complex viscosity of the resulting HSTC composition as measured on the rheometer under conditions described in Reference Example 2 is 7,376 Pa·s at 30° C. and −10 Pa·s at 90° C. The HSTC composition can be pressed between two release liners to form-stable, tacky, flexible, 6 mil thick film at room temperature The HSTC composition is used to prepare assemblies between two silicon substrates as described in Reference Example 1. The bondline thickness of the HSTC composition within the assembly at 90° C., under different compressive pressure is listed in Table 1, along with the thermal impedance as measured by laser flash at those bondline thicknesses.

TABLE 1

| Pressure (KiloPascals) (kPa) | Bondline Thickness (micrometers) ($\mu$m) | Thermal Impedance (cm$^2$ ° K/W) |
|---|---|---|
| 28 | 74 | 0.45 |
| 138 | 52 | 0.40 |

Example 2

A silicone resin of the formula: $(Ph_2SiO_{2/2})_{19}(Me_2SiO_{2/2})_{19}(PhSiO_{3/2})_{37}(MeSiO_{3/2})_{25}$ is combined with $Al_2O_3$ filler (2:1 mixture of CB-A20S and Al-43-Me aluminum oxide fillers from Showa-Denko K.K.) by heating the resin and filler to 80° C. and centrifugal mixing. The mixture has 88.08 weight % filler loading.

The complex viscosity of the resulting HSTC composition as measured on the rheometer under conditions described in Reference Example 2 is 13,932 Pa·s at 30° C. and 190 Pa·s at 90° C. The HSTC composition can be pressed between two release liners to form-stable, tacky, flexible, 6 mil thick film at room temperature The HSTC composition was used to prepare assemblies between two silicon substrates as described in Reference Example 1. The bondline thickness of the HSTC composition within the assembly at 90° C., under different compressive pressure is listed in Table 2, along with the thermal impedance as measured by laser flash at those bondline thicknesses.

TABLE 2

| Pressure (kPa) | Bondline Thickness ($\mu$m) | Thermal Impedance (cm$^2$ ° K/W) |
|---|---|---|
| 28 | 103 | 0.54 |
| 138 | 90 | 0.44 |

Example 3

A silicone resin/silicone polymer blend consisting of (i) 61.08% by weight of an organopolysiloxane resin consisting of $(CH_3)_3SiO_{1/2}$ siloxane units and $SiO_{4/2}$ siloxane units, wherein the resin has a number-average molecular weight of 2,600, the mole ratio of $(CH_3)_3SiO_{1/2}$ units to $SiO_{4/2}$ units is 0.9:1, and the resin contains less than 1 percent by weight of silicon-bonded hydroxyl groups and (ii) 38.92% by weight of a dimethylvinylsiloxy-terminated polydimethylsiloxane having a viscosity of about 0.3 to 0.6 Pascal seconds (Pa s) at 25° C. is used as the matrix in this example. The above resin/polymer blend is mixed with $Al_2O_3$ filler (2:1 mixture of CB-A20S and Al-43-Me aluminum oxide fillers from Showa-Denko K.K.) and Stearic Acid (Aldrich Chemical Company) as filler treating agent by heating the resin and filler to 80° C. and centrifugal mixing. The mixture contains 88.08 weight % filler, 0.6 weight % stearic acid, and 11.32 weight % of the matrix.

The complex viscosity of the resulting HSTC composition as measured on the rheometer under conditions described in Reference Example 2 is 96,691 Pa·s at 30° C. and 1,996 Pa·s at 90° C. The resulting HSTC composition can be pressed between two release liners to form-stable, tacky, flexible, 6 mil thick film at room temperature.

The HSTC composition is used to prepare assemblies between two silicon substrates as described in Reference Example 1. The bondline thickness of the HSTC composition within the assembly at 90° C., under different compressive pressure is listed in Table 3, along with the thermal impedance as measured by laser flash at those bondline thicknesses.

TABLE 3

| Pressure (kPa) | Bondline Thickness ($\mu$m) | Thermal Impedance (cm$^2$ ° K/W) |
|---|---|---|
| 28 | 92 | 0.43 |
| 138 | 74 | 0.37 |

Example 4

A silicone resin of the formula: $(Ph_2SiO_{2/2})_{19}(Me_2SiO_{2/2})1\ _9(PhSiO_{3/2})_{37}(MeSiO_{3/2})_{25}$ is combined with Boron Nitride filler (PT350S from Advanced Ceramics Corporation) by heating the resin and filler to 100° C. and centrifugal mixing. The mixture has 54.87 weight % filler loading.

The complex viscosity of the resulting HSTC composition as measured on the rheometer under conditions described in Reference Example 2 is 455,640 Pa·s at 30° C. and 10,058 Pa·s at 90° C. The resulting HSTC composition can be pressed between two release liners to form-stable, tacky, flexible, 6 mil thick film at room temperature The HSTC composition is used to prepare assemblies between two silicon substrates as described in Reference Example 1. The bondline thickness of the material within the assembly at 90° C., under different compressive pressure is listed in Table 4, along with the thermal impedance as measured by laser flash at those bondline thicknesses.

TABLE 4

| Pressure (kPa) | Bondline Thickness ($\mu$m) | Thermal Impedance (cm$^2$ ° K/W) |
|---|---|---|
| 28 | 190 | 1.33 |
| 138 | 163 | 0.89 |

What is claimed is:
1. A composition comprising:
   A) a matrix comprising
      i) 4 to 60% based on the weight of the composition of a silicone resin, and
      ii) 0 to 35% based on the weight of the composition of a silicone polymer;
   B) 40 to 96% based on the weight of the composition of a thermally conductive filler;
   C) 0 to 5% based on the weight of the composition of a treating agent; and
   D) 0 to 1% based on the weight of the composition of an antioxidant: where component i) comprises a DT resin, an MQ resin, or a combination thereof.
2. The composition of claim 1, where the composition is formulated to soften and flow at a temperature of at least 40° C.
3. The composition of claim 1, where component i) comprises a DT resin comprising:
   $(R^1R^2SiO_{2/2})_a(R^3SiO_{3/2})_b$, where each $R^1$ independently represents a hydroxyl group or an organic group, each $R^2$ independently represents a hydroxyl group or an organic group, each $R^3$ independently represents a hydroxyl group or an organic group, a is at least 1, a is up to 200, b is at least 1, and b is up to 100.

4. The composition of claim 3, where each $R^1$ is independently phenyl, tolyl, xylyl, benzyl, phenethyl, methyl, ethyl, n-propyl, isopropyl, n-butyl, or t-butyl;

each $R^2$ is independently phenyl, tolyl, xylyl, benzyl, phenethyl, methyl, ethyl, n-propyl, isopropyl, n-butyl, or t-butyl;

each $R^3$ is independently phenyl, tolyl, xylyl, benzyl, phenethyl, methyl, ethyl, n-propyl, isopropyl, n-butyl, or t-butyl;

a is at least 1;

a is up to 100;

b is at least 1; and bis up to 75.

5. The composition of claim 1, where component i) comprises a DT resin of the formula:

$(R^1{}_2SiO_{2/2})_a(R^2{}_2SiO_{2/2})_b(R^1SiO_{3/2})_c(R^2SiO_{3/2})_d$, where each $R^1$ independently represents a hydroxyl group or an organic group, each $R^2$ independently represents a hydroxyl group or an organic group, a is at least 1, a is up to 100, b is at least 1, and b is up to 100.

6. The composition of claim 1, where component i) comprises an MQ resin comprising: $(R^1R^2R^3 SiO_{1/2})_c(SiO_{4/2})_d$, each $R^1$ independently represents a hydroxyl group or an organic group, each $R^2$ independently represents a hydroxyl group or an organic group, each $R^3$ independently represents a hydroxyl group or an organic group, c is at least 1, c is up to 100, d is at least 1, d is up to 100, and average ratio of c/d is 0.65 to 1.9.

7. The composition of chum 1, where component ii) is present and has the formula $(R^1R^2R^3SiO_{1/2})_2(R^1 R^2SiO_{2/2})_e$, where each $R^1$ independently represents a hydroxyl group or an organic group, each $R^2$ independently represents a hydroxyl group or an organic group, each $R^3$ independently represents a hydroxyl group or an organic group, e is at least 5, and e is up to 800.

8. The composition of claim 7, where component ii) is a polydiorganosiloxane.

9. The composition of claim 1, where component B) is electrically conductive.

10. The composition of claim 1, where component B) is electrically insulating.

11. The composition of claim 1, where component B) comprises aluminum nitride, aluminum oxide, barium titinate, beryllium oxide, boron nitride, diamond, graphite, magnesium oxide, metal particulate, silicon carbide, tungsten carbide, zinc oxide, or a combination thereof.

12. The composition of claim 1, where component C) is present and comprises an alkoxysilane having the formula: $R^4{}_fSi(OR^5)_{(4-f)}$, where $R^4$ is a substituted or unsubstituted monovalent hydrocarbon group of at least 1 carbon atoms and up to 50 carbon atoms, each $R^5$ is independently an unsubstituted, saturated hydrocarbon group of at least 1 carbon atom and up to 4 carbon atoms, and f is 1, 2, or 3.

13. The composition of claim 1, where component C) is present and comprises an alkoxysilane, an alkoxy-functional oligosiloxane, an alkyithiol, a fatty acid, an alcohols, or a combination thereof.

14. The composition of claim 1, where component D) is present and comprises a phenolic antioxidant or a combination of a phenolic antioxidant and a stabilizer.

15. The composition of claim 1, further comprising an optional component comprising E) an inhibitor; F) an organofunctional silicone wax, a silicone-organic block copolymer, or a combination thereof; G) a vehicle; H) a wetting agent; I) an agent; J) a pigment; K) a flame retardant; L) a spacer; M) a low melting metal filler; N) a reinforcing filler: or a combination thereof.

16. An interface material comprising I) the composition of claim 1, where the composition is formed as a flat member, a hemispherical nubbin, a convex member, a pyramid, or a cone.

17. The interface material of claim 16, further comprising II) a release sheet, where the release sheet covers a surface of the composition.

18. The interface material of claim 17, where the composition is coated on a surface of a substrate.

19. The interface material of claim 17, where the substrate comprises a metal foil, a perforated metal foil, a polyamide sheet, a polyimide sheet, or a polyethylene terephthalate polyester sheet.

20. The interface material of claim 18, where the composition is coated on two sides of the substrate.

21. The interface material of claim further comprising II) a release sheet covering a surface of the composition opposite the substrate.

22. A method comprising:

i) interposing the composition of claim 1 along a thermal path between a heat source and a heat spreader.

23. The method of claim 22, wherein the heat source comprises an electronic component.

24. The method of claim 22, where the heat spreader comprises a heat sink, a thermally conductive plate, a thermally conductive cover, a fan, or a circulating coolant system.

25. The method of claim 22, further comprising:

ii) heating the composition to a temperature equal to or greater than softening temperature of the composition, and iii) applying pressure to the composition.

26. The method of claim 25, further comprising:

iv) cooling the composition to a temperature less than the phase change temperature.

27. A device comprising:

a) an electronic component, b) an interface material, and c) a heat sink;

where the interface material is arranged along a thermal path extending from a surface of the electronic component to a surface of the heat sink, where the interface material comprises the composition of claim 1.

28. A device comprising:

a) a heat spreader, and b) an interface material on a surface of the heat spreader, where the interface material and the heat spreader are configured to comprise a portion of a thermally conductive path between an electronic component and a heat sink, and where the interface material comprises the composition of claim 1.

* * * * *